US007332920B1

(12) United States Patent
Arlow

(10) Patent No.: US 7,332,920 B1
(45) Date of Patent: Feb. 19, 2008

(54) PULSED THERMAL MONITOR

(75) Inventor: Gregory A. Arlow, Southampton, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 105 days.

(21) Appl. No.: 11/226,876

(22) Filed: Sep. 14, 2005

Related U.S. Application Data

(62) Division of application No. 10/702,001, filed on Nov. 5, 2003, now Pat. No. 7,034,556.

(51) Int. Cl.
*G01R 31/02* (2006.01)
*H05B 1/00* (2006.01)

(52) U.S. Cl. ........................ 324/760; 702/130; 713/322

(58) Field of Classification Search ..................... None
See application file for complete search history.

(56) References Cited

U.S. PATENT DOCUMENTS 5,557,551 A 9/1996 Craft .......................... 702/130
6,367,023 B2 * 4/2002 Kling et al. ................ 713/340
6,487,668 B2 11/2002 Thomas et al. ............. 713/322
6,557,072 B2 4/2003 Osborn ....................... 711/106
6,564,328 B1 * 5/2003 Grochowski et al. ....... 713/320
6,650,132 B2 11/2003 Pelissier ..................... 324/760
6,704,876 B1 3/2004 Iacobovici et al. ......... 713/300

* cited by examiner

*Primary Examiner*—Ernest Karlsen
(74) *Attorney, Agent, or Firm*—Duane Morris, LLP

(57) ABSTRACT

A power solid-state device is pulsed from a controlled pulse source, which generates heat in the chip. Similar or identical pulses are applied to a software or equivalent electrical hardware temperature simulator, for predicting the chip temperature. The output of the simulator is monitored, and the controlled pulse source is inhibited in the event that the predicted chip temperature exceeds a limit. A delay may be introduced between the pulse generation and application to the chip. Additional temperatures associated with the chip heat sink may be combined with the chip temperature.

3 Claims, 6 Drawing Sheets

PULSED THERMAL MONITOR

CONTINUING DATA

This application is a division of Ser. No. 10/702,001, filed Nov. 5, 2003, now U.S. Pat. No. 7,034,556.

FIELD OF THE INVENTION

This invention relates to limiting or controlling the temperature of a solid-state or other device subject to varying power energization by simulation of the temperature characteristics of the device in response to such energization, and feeding back the resulting temperature information to the controller.

BACKGROUND OF THE INVENTION

Solid-state devices are well known to have reliability and performance which are strongly related to the temperature of the solid-state die. A transistor or other solid-state or semiconductor device operated at a temperature in excess of its rated temperature experiences significant performance degradation, and its operating lifetime can also be significantly reduced or the device may be irreparably damaged. Most semiconductor and solid-state devices are distributed in a protective package containing the semiconductor or solid state device. The user (a design engineer making higher-level equipment) works with the packaged solid-state device or semiconductor, which is often referred to as though it was simply the semiconductor or solid state device itself. Such packaged solid state devices have electrical and thermal characteristics that are specified by the manufacturer. The user receives or acquires information relating to the maximum temperature of the package, possibly the thermal resistance between the exterior of the package and the chip or die contained therein, maximum allowable voltages, leakage currents, and the like. The user, armed with this information, decides on a physical and thermal mounting method for the packaged device taking into account the expected operating temperature of the device in view of the power dissipated in the device, the thermal resistance between the device and its package, and between the package and the ultimate heat sink or ambient temperature. Many solid-state devices operate with substantially constant electrical power, so the power dissipated in the device remains relatively constant. In such a situation, even a sensitive device may be adequately protected by a thermal sensor connected to the package of the device or a location thermally more remote, connected so that an over-temperature condition results in shutdown of power to the device.

Some modern power solid state devices, such as transistors, are used at high or "RF" frequencies in radar transmitter applications in which the applied power is pulsatory, and in which the applied pulse duration varies from moment to moment in response to range and other requirements of the radar system. Such transistors are often operated near the temperature limits of their capability for maximum performance, with the result that slight variations of temperature may degrade the expected performance or tend toward early failure. Transient thermal performance limitations are imposed by the desire to maintain semiconductor die temperature below the maximum tolerable temperature, however defined, which is usually a maximum of 150° C., while at the same time achieving maximum RF output power with minimum pulse-to-pulse phase variation. Under these conditions, monitoring the temperature of the device package or a thermally remote location may not be sufficient to adequately preserve and protect the device.

There are numerous factors which come into consideration when designing and optimizing performance of the transient temperature behavior associated with solid-state devices, and particularly RF solid-state devices. These include the thermal time constants within the solid-state device itself, including die attach methods, gate pitch spacing, die thickness, and baseplate metal/packaging considerations. Additional considerations include the characteristics of the device-package-to-ambient (heat sink) thermal path. In addition, the pulse width (duration), duty cycle (duty), and RF conversion efficiency must be considered. The ability to analyze transient performance characteristics for widely variable pulse widths and duty cycles as encountered in multifunction radar further compounds the problem of determining and accounting for worst-case performance limitations associated with the pulsewidth, duty cycle, and pulse-to-pulse phase repeatability, which is driven by pulse-to-pulse temperature variation of the solid-state device. Finite-element analysis has been employed to aid in making such determinations, but is limited, at least in part, by the large number of finite elements which are required to suitably model flow, particularly for the fine element structures used in RF transistors and devices. Finite-element modeling can consume many CPU hours to determine steady-state pulse-to-pulse peak temperature excursions for constant-duty waveforms. The result of the finite element analysis is used in conjunction with worst-case thermal analysis to select thermal protective devices such as bimetallic switches, biased diode junction monitors, or thermocouple/thermistor monitor circuits, which are placed on heatsinks external to the actual solid state device or die. The thermal decoupling between the thermal protective devices and the actual solid-state device may result in protective performance which does not allow the solid-state device to operate continuously near its maximum allowable temperature, so the device is operated at a lower temperature, which is also a lower power level condition. Operation at higher power and near the maximum allowable temperature, which is desirable from a performance point of view, in turn may require the use of additional monitors to limit pulse width and duty rates to protect the transmit functions from degradation or failure due to excursions above the maximum allowable temperature of the solid-state device.

Improved thermal protection arrangements for solid-state devices are desired.

SUMMARY OF THE INVENTION

A power device according to an aspect of the invention includes a solid-state device having (a) a thermal mass and (b) reliability and performance characteristics which vary in response to the temperature of the solid-state device. The power device also includes a controllable powering arrangement for controllably providing power to the solid-state device. A controller is coupled to the controllable powering arrangement, for controlling the controllable powering arrangement for providing power in a manner that includes pulses of selectable at least one of amplitude and duration. As a result, or whereby, the power produced in the solid-state device varies from time to time. A heat transfer arrangement is coupled to the solid-state device for transferring heat from the solid-state device. The heat transfer arrangement includes thermal masses mutually separated by thermal impedances, whereby the temperature of the solid-state device varies in response to the power, thermal masses, and thermal impedances. A simulator is coupled to one of the controller and the powering arrangement, and generates an electrical analog of (a) the thermal masses separated by thermal impedances of the heat transfer arrangement and (b) the thermal mass of the solid-state device, where the simulation means analogizes an electrical characteristic, such as voltage, to the temperature of the solid-state device. A limiter is coupled to the simulator and to the controller, for monitoring the electrical characteristic, and for preventing the controller from commanding the production of power for application to the solid-state device in an amount deemed to raise the temperature of the solid-state device, as represented by the electrical characteristic, above a predetermined temperature.

In a particularly advantageous version of this aspect of the invention, the simulator is implemented in software. In a most preferred embodiment, the software is Pspice. In a particular embodiment of the invention, a delay is interposed between the generation of the pulses and the time they are applied to the chip, in order to provide time for processing of the pulses in the simulator to determine the temperature which will be achieved. Additional temperatures along the heat flow path of the chip may be monitored and processed together with the chip-temperature-representative signal to produce composite limiting signals. The limiting value of the temperature may be fixed during operation.

DESCRIPTION OF THE INVENTION

Figure 1:
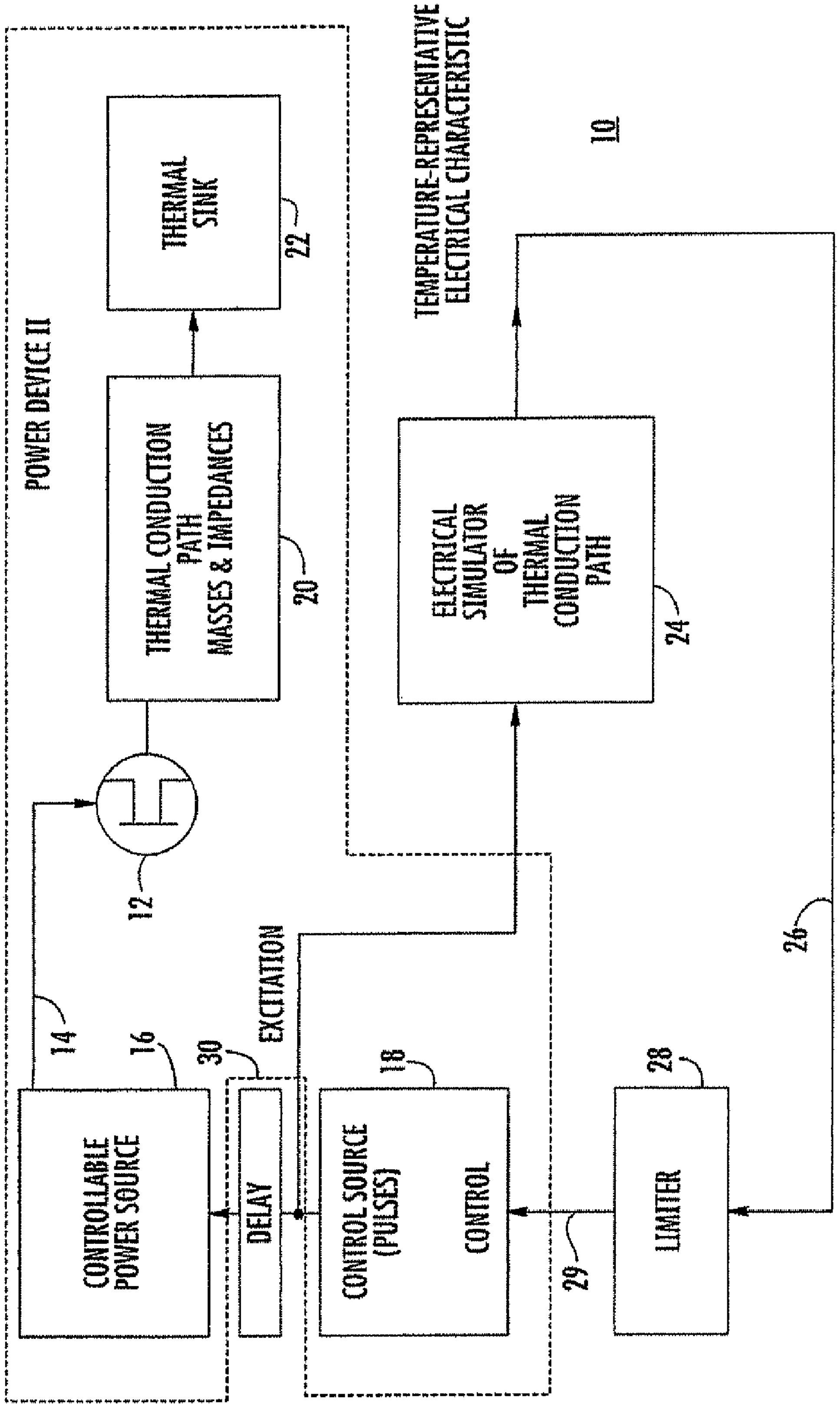
FIG. 1 is a simplified diagram of a system according to an aspect of the invention.

In system 10 of FIG. 1, a power solid-state device is illustrated by a field-effect transistor (FET) symbol 12. FET 12 may be used for any of a number of purposes, such as, for example, amplification of radio-frequency signals, and the connections required for such purposes are not illustrated. Solid-state device 12 receives, by way of a path 14, electrical power in the form of pulses and bursts of pulses from a controllable power supply 16. A controller 18 interacts with other portions of system 10 to command the generation of pulses of variable amplitudes, durations, or both. The commands are referred to generally as excitation. As a result of the variable excitation, solid-state device 12 generates heat at a variable rate, depending upon the integrated applied power, and also depending upon the rate at which heat flows from the device 12. Heat is removed from device 12 by way of a thermal path designated 20, and the heat ultimately flows to an ambient temperature illustrated as a "sink" block 22.

Samples of the excitation, or samples of the controlled power on path 14 of FIG. 1, are applied to an electrical simulator device illustrated as a block 24. Simulator device 24 is an analog or simulator of the thermal characteristics of the device 12, thermal conduction path 20, and sink 22. As such, simulator block 24 generates an electrical characteristic, such as a voltage, which is an analog of the instantaneous temperature of the chip or die of the solid-state device 12, to the extent that the analogy of the simulator to the thermal characteristics is valid. This electrical characteristic representative of the (estimated or analogized) instantaneous temperature of the chip or die, in turn, is used to control the excitation in order to limit the maximum instantaneous temperature of the chip or die to be less than some predetermined value. The predetermined value may be fixed or variable. In FIG. 1, the electrical analog signal produced by simulator block 24 in response to the excitation is applied by way of an electrical path illustrated as 26 to a limiter function illustrated as a block 28. Limiter 28 compares the indicated chip or die temperature with the limiting value, and generates a signal for application to control block 18 for either disabling the excitation, or for modifying the excitation to reduce the power applied to the chip or die 12.

It may be desirable to delay the application of the excitation from controller 18 to power source 16, so that the simulator 24 has time to perform its calculations, and to generate a predicted temperature which has not yet actually occurred. This prediction, in turn, allows the excitation to be modified before the chip or die temperature actually reaches the estimated value. Such a delay allows a better measure of control. In FIG. 1, the excitation is delayed by a delay block 30.

Figure 2:
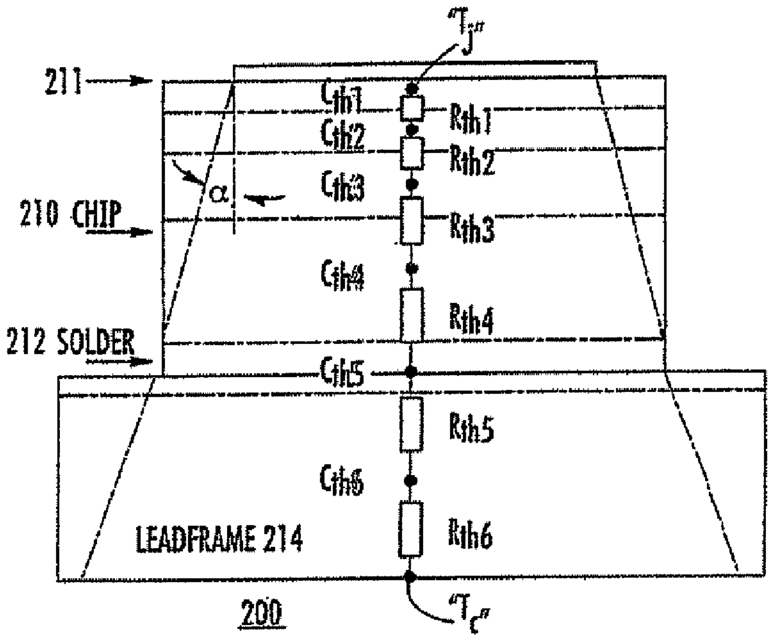
FIG. 2 (PRIOR ART)
FIG. 2 is a simplified diagram illustrating a solid-state chip and a typical mounting for power applications, to show the various thermal masses and flow paths.

FIG. 2 is a simplified cross-sectional diagram of a solid-state device such as a semiconductor chip together with a portion of its mounting. In FIG. 2, a chip or semiconductor region 210 is held by a layer 212 of solder to a lead frame 214. The active portion of the chip 210 is deemed to be in the uppermost portion of the structure, at the level or location designated 211, and having the "junction" temperature Tj. The heat is generated mainly in this upper layer or level. The remaining portion of the semiconductor material extends from the upper level 211 to the solder layer 212 designated "solder," and has thermal mass and thermal resistance. The solder layer is thermally conductive and also has thermal mass. The lowermost "leadframe" layer 214 spreads the heat, has thermal mass, and also thermal resistance. In the simplified arrangement of FIG. 2, the heat sink is deemed to be the ambient temperature $T_c$ at the lowermost level 215 of leadframe 214. In FIG. 2, the uppermost layer or level 211 of chip 210 has thermal capacitance or delay designated $C_{th1}$, and a thermal resistance designated $R_{th1}$ extending to the next lower level or layer. The chip portion may be viewed as being made up of a cascade of thermal capacitances and resistances. More particularly, the uppermost level 211 of chip 210 is thermally coupled to the lowermost level adjacent the solder layer 212 by the combination of capacitances and resistances arranged in the order $C_{th1}$, $R_{th1}$, $C_{th2}$, $R_{th2}$, $C_{th3}$, $R_{th3}$, $C_{th4}$, and $R_{th4}$. Solder layer 212 is deemed to have a thermal capacitance $C_{th5}$. The leadframe 214 is deemed to have series thermal resistances $R_{th5}$ and $R_{th6}$ and a thermal capacitance $C_{th6}$. As mentioned, the lowermost level of leadframe 214 is deemed or assumed in this simplified representation to be at ambient temperature $T_c$.

Figure 3A:
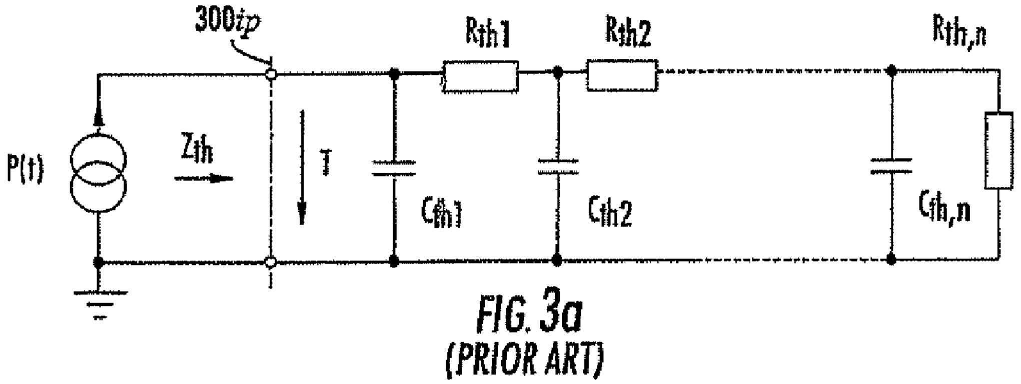
FIG. 3a (PRIOR ART)
FIG. 3*a* is a thermal flow diagram in electrical form, corresponding to the structure of FIG. 2.
Figure 3B:
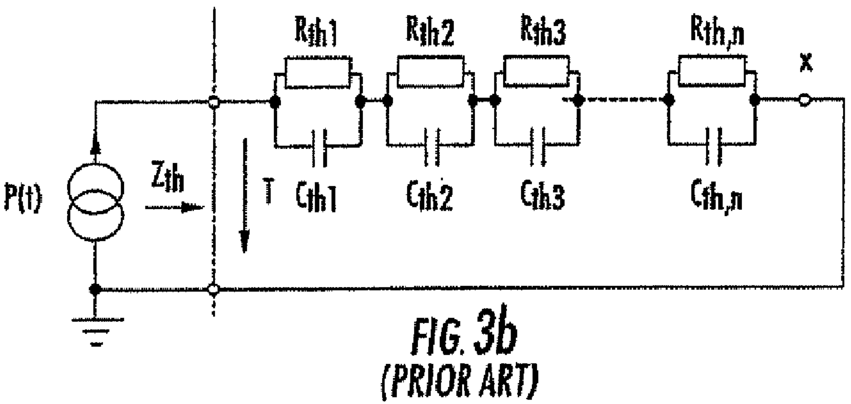
FIG. 3b (PRIOR ART)
FIG. 3*b* is an equivalent to the thermal flow diagram of FIG. 3*a;*

FIG. 3*a* is a prior-art representation of the thermal paths or "circuit" of FIG. 2 in a "shunt" transmission-line electrical format, and FIG. 3*b* is a prior-art representation of the thermal paths of FIG. 2 arranged in a "series" transmission-line representation. As illustrated in FIG. 3*a*, the shunt transmission-line analog includes a current source P(t) driving the thermal impedance Zth representing the total impedance of all the thermal elements $C_{th1}$, $R_{th1}$, $C_{th2}$, $R_{th2}$, $C_{th3}$, $R_{th3}$, $C_{th4}$, and $R_{th4}$ presented at "input port" plane 300*ip*, corresponding to active junction plane or level 211 of FIG. 2. The temperature at the active level 211 is represented by the voltage T at transmission-line input plane 300*ip*. The shunt (parallel arranged or connected) elements are $C_{th1}$, $C_{th2}$, . . . , and $C_{thn}$, and the series-connected elements are $R_{th1}$, $R_{th2}$, . . . , and $R_{thn}$. Similarly, in FIG. 3*b*, the series transmission-line is formed by a series string of paralleled resistances and capacitances. More particularly, the transmission line is comprised of the series combination of $R_{th1}$ in parallel with $C_{th1}$, $R_{th2}$ in parallel with $C_{th2}$, . . . , and $R_{thn}$ in parallel with $C_{thn}$. Such transmission-line circuits, and other more complex circuits, can be readily analyzed by electrical circuit simulation software. One example of such software is Pspice.

Figure 4:
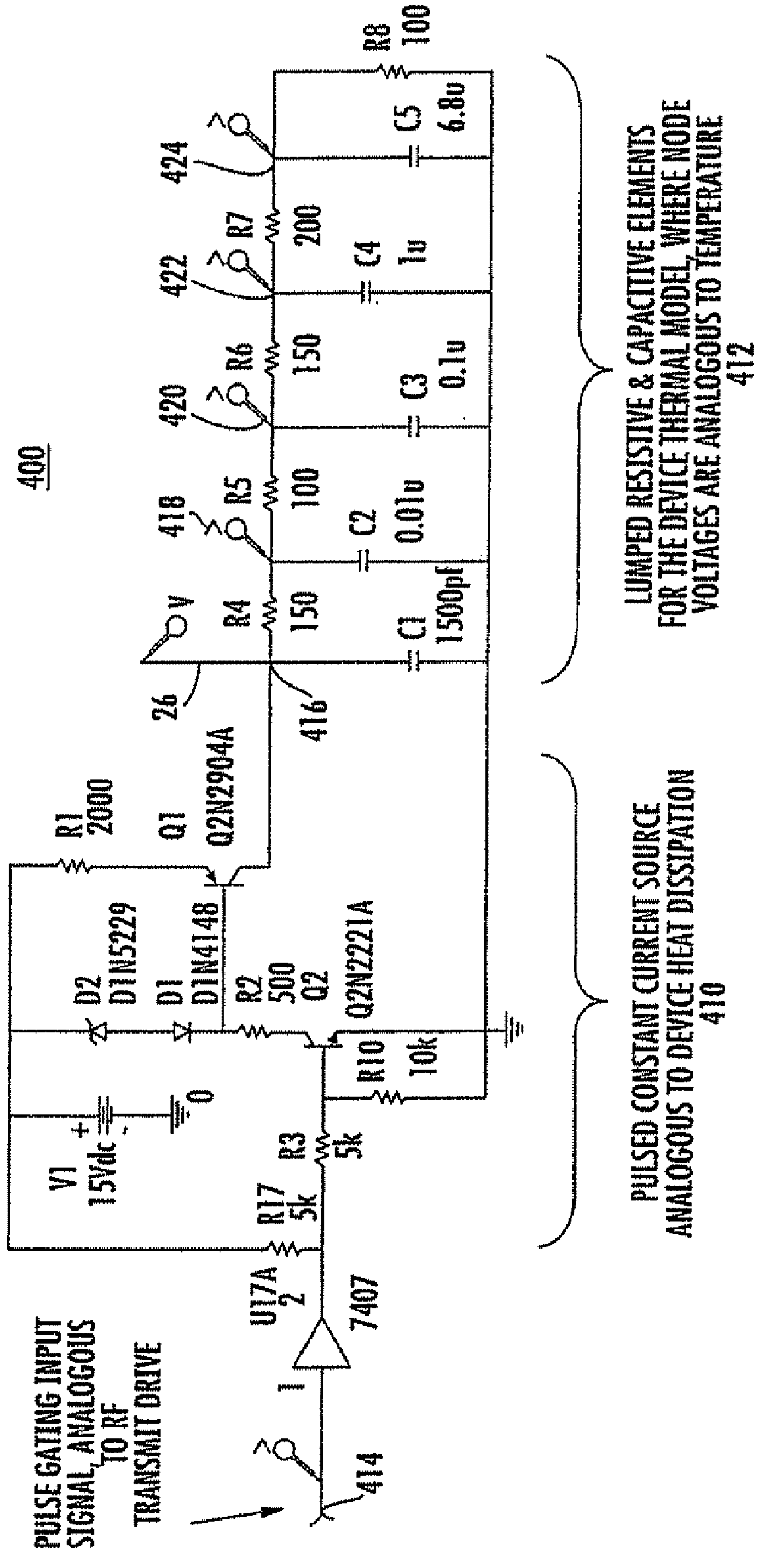
FIG. 4 is an electrical analog of the thermal flow diagram of FIG. 3*a;*

In order to place the general circuits represented by FIGS. 3*a* and 3*b* into form for analysis, it is desirable to make the circuit more specific, and to insert values which provide the proper scaling. FIG. 4 is a representative circuit which includes a current source portion 410 which is a pulsed constant current source which is analogous to the heat dissipated or generated in the active portion of the structure 200 of FIG. 2. The current source 410 is controlled by a pulse gating signal applied to the input port 414, which signal is analogous to the transmitter drive waveform produced by the controller 18 or the power source 16 of FIG. 1. Details of the circuit of FIG. 4 are not particularly material to the invention, as those skilled in the art know how to generate a circuit having the desired characteristics representative of the thermal quantities associated with the solid state device of FIG. 2. In the circuit 400 of FIG. 4 which is to be simulated by the software circuit simulator, the voltage at any location along the lumped resistive and capacitive elements of the transmission line 412 corresponds to, or is analogous to, the temperature at the corresponding thermal location. The "output" of the software circuit simulator is taken as the voltage at the "input" port 416 of the transmission line 412 (relative to ground).

In FIG. 4, a pulsed gating input signal, analogous to the RF transmitter drive of FIG. 1, is applied to input port 414, and by way of an amplifier U17A to the junction of resistors R3 and R17. Resistor R17 is connected to a source V1 of +15 direct volts. That end of resistor R3 remote from output port 2 of amplifier U17A is connected to the base of a grounded-emitter bipolar NPN transistor Q2. A resistor R10 connects the base of transistor Q2 to ground. The collector of transistor Q2 is connected to the base of a further bipolar PNP transistor Q1 by way of a series resistor R2. The base of transistor Q1 is connected to source V1 by way of the series connection of a diode D1 and a zener diode D2, with diode D1 having its cathode adjacent the base of transistor Q1. Zener diode D2 has its anode adjacent the anode of diode D1. A resistor R1 connects source V1 to the emitter of transistor Q1. The collector of transistor Q1 is equivalent to a constant current source 410 which is pulsed by the input signal applied to port 414. The pulsed constant current of source 410 is manifested at the collector of transistor Q1, and is applied to a lumped resistive and capacitive transmission line 412, corresponding or analogous to the thermal model. The voltages at various locations along the transmission line 412 are equivalent of the temperatures at various locations in the corresponding thermal equivalent. In the transmission line 412 of FIG. 4, the input location 416 is equivalent to the chip or die of the structure of FIG. 2, and the voltage at location 416 therefore corresponds to voltage $V_j$ of FIG. 2. For completeness, location 416 of transmission line 412 of FIG. 4 is connected to ground by a capacitor C1. A series resistor R4 connects location 416 to a node 418, and a capacitor C2 connects node 418 to ground. A series resistor R5 connects node 418 to a node 420, and a capacitor C3 connects node 420 to ground. A series resistor R6 connects node 420 to a node 422, and a capacitor C4 connects node 422 to ground. A resistor R7 connects node 422 to a node 424, and a shunt capacitor C5 connects node 424 to ground. A resistor R8 parallels capacitor C5.

In the embodiment of the electrical analog of the thermal model of FIG. 4, the elements have the following values.

| | |
|---|---|
| R1 | 2000 ohms |
| R2 | 500 ohms |
| R3 | 5000 ohms |
| R4 | 150 ohms |
| R5 | 100 ohms |
| R6 | 150 ohms |
| R7 | 200 ohms |
| R8 | 100 ohms |
| R10 | 10k ohms |
| R17 | 5k ohms |
| C1 | 1500 pF |
| C2 | 0.01 uF |
| C3 | 0.01 uF |
| C4 | 1.0 uF |
| C4 | 1.0 uF |
| C5 | 6.8 uF |
| D1 | type D1N4148 |
| D2 | type D1N5229 |
| Q1 | type 2N2904A |
| Q2 | type 2N2221A |

These values are used in the PSpice electrical circuit simulator 24 of FIG. 1.

Figure 5:
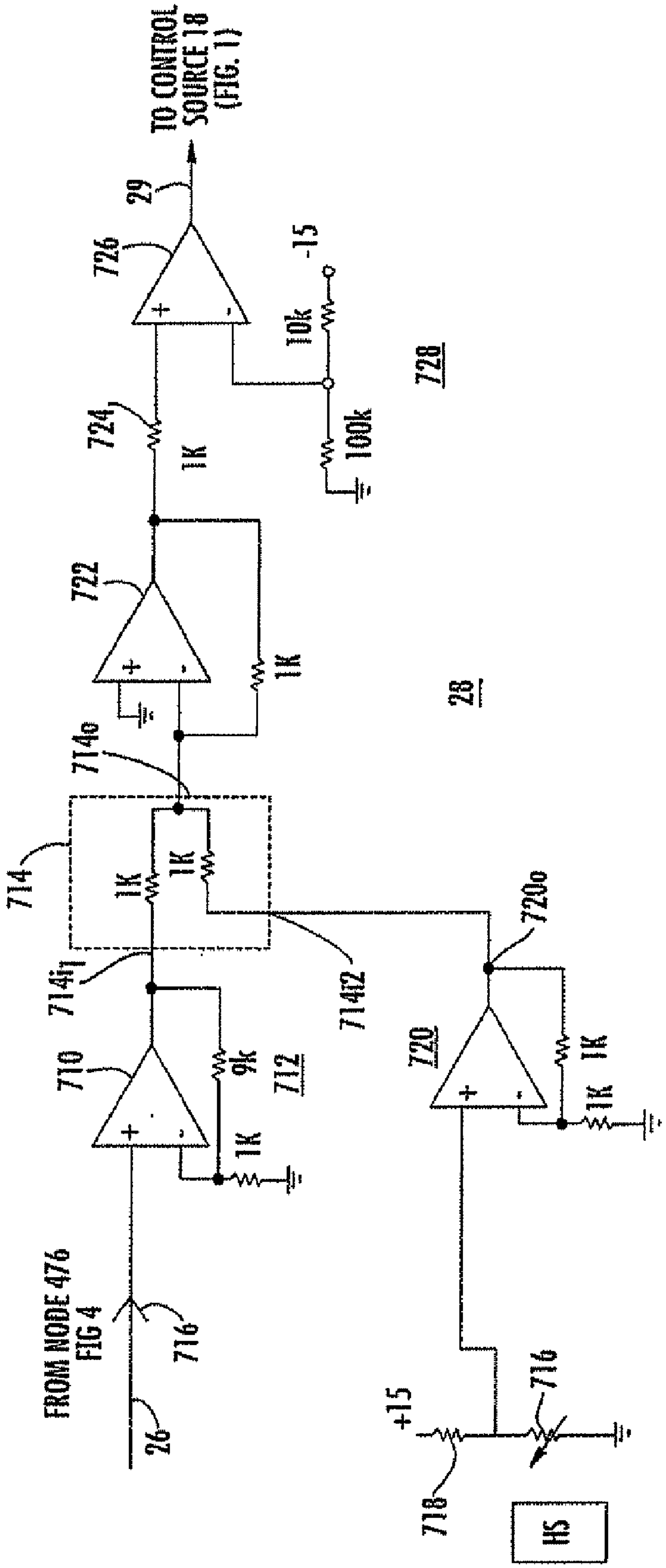
FIG. 5 is a simplified schematic diagram of a limiter which may be used in the arrangement of FIG. 1.

Referring once again to FIG. 1, the output voltage from the software simulator 24 is a voltage, representing the temperature at the active portion of the chip. This voltage is applied over a signal path illustrated as 26 to limiter block 28, which at least scales the voltage and compares the voltage with a reference voltage representing the maximum allowable temperature of the active portion of the chip. The results of this comparison may be viewed as a go/nogo signal, which shuts down the controller 18 upon the occurrence of a nogo signal. Limiter 28 truncates the pulses from control source 18 when an excessive peak temperature condition is sensed, by latching off the control source pulse fed to the controllable power source 16. This pulse truncation eliminates the heat generation in the transistor 12, at least for the duration of the eliminated pulse, thereby preventing the temperature from rising further. Reset from the latch condition is accomplished by reset of the latch at the falling or lagging edge of the truncated control source pulse, or at the leading edge of the next non-truncated control source pulse. This allows the circuit to process the next consecutive pulse, so long as excessive temperature is not predicted as a result of that pulse. FIG. 5 is a simplified schematic diagram illustrating details of one embodiment of a limiter circuit 28 of FIG. 1.

FIG. 5 is a simplified diagram illustrating details of limiter 28 of FIG. 1. In FIG. 5, an input port or terminal 716 receives the chip-temperature-representative or prediction signal from node 416 of FIG. 4. The prediction signal is applied to the noninverting (+) input port of an amplifier 710, which includes feedback from its output port 710*o* to its inverting (−) input port by way of a resistive voltage divider designated 712. The amplified chip temperature prediction signal is applied from output port 710*o* to a first input port 714*i*1 of a signal summing circuit 714. A thermistor or other temperature sensing device 716 is connected to the transistor heat sink HS, and is biased by a source of direct voltage by way of a resistor 718. The heat sink temperature signal from device 716 is applied to the noninverting (+) input port of a unity-gain feedback amplifier or buffer designated generally as 720. The buffered heat sink temperature signal is applied from an output port 720*o* of buffer 720 to a second input port 714*i*2 of summing circuit 714. A signal appears at output port 714*o* of summing circuit 714 which represents a summation of both chip and heat sink temperatures. The summed signal is applied to the inverting (−) input terminal of an inverting feedback amplifier designated generally as 722. The output of amplifier 722 is applied by way of a resistor 724 to the noninverting input port of a comparator or high-gain amplifier designated 726, for comparison with a reference or threshold voltage generated by a voltage divider designated 728. When the sum of the predicted chip temperature and the heat sink temperature, appearing at the output port 714*o* of summing circuit 714, reaches the predetermined limit represented by the voltage of voltage divider 728, comparator 726 switches state, and produces on conductor 29 the limiting signal. As described in conjunction with FIG. 1, the limiting signal on conductor 29 is applied to pulse control source 18 for inhibiting pulses.

Figure 6A:
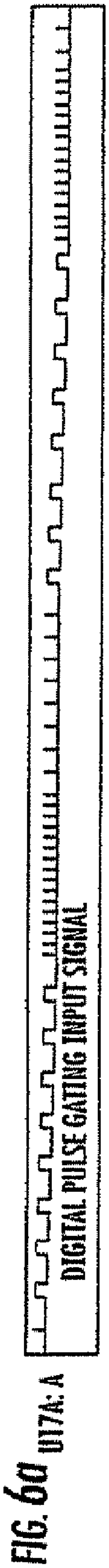
FIG. 6*a* is a voltage-time plot of an excitation which may be applied to a chip.
Figure 6B:
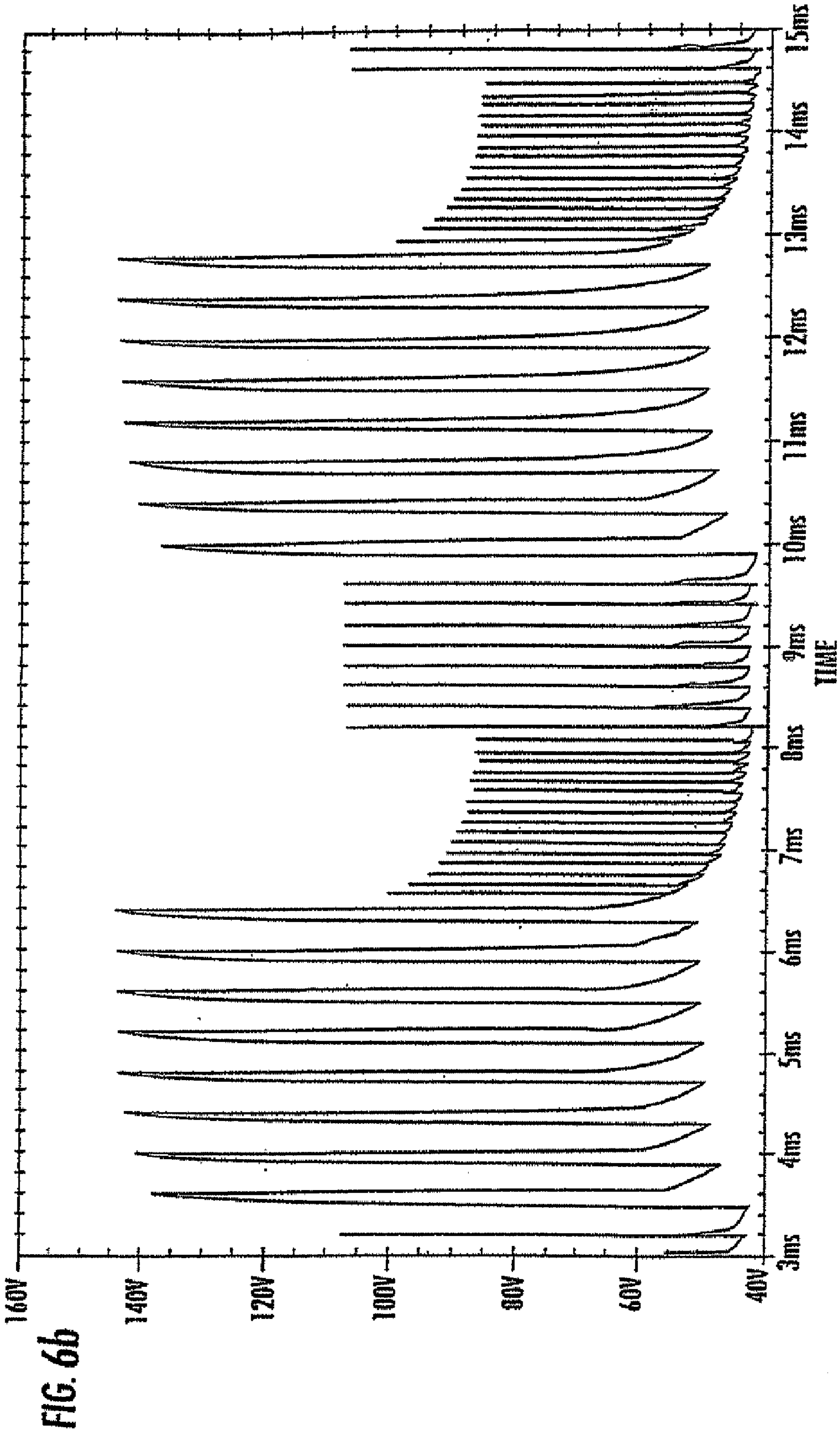
FIG. 6*b* is a plot of the analytically determined temperature of a chip equivalent to that of FIG. 2.
Figure 6C:
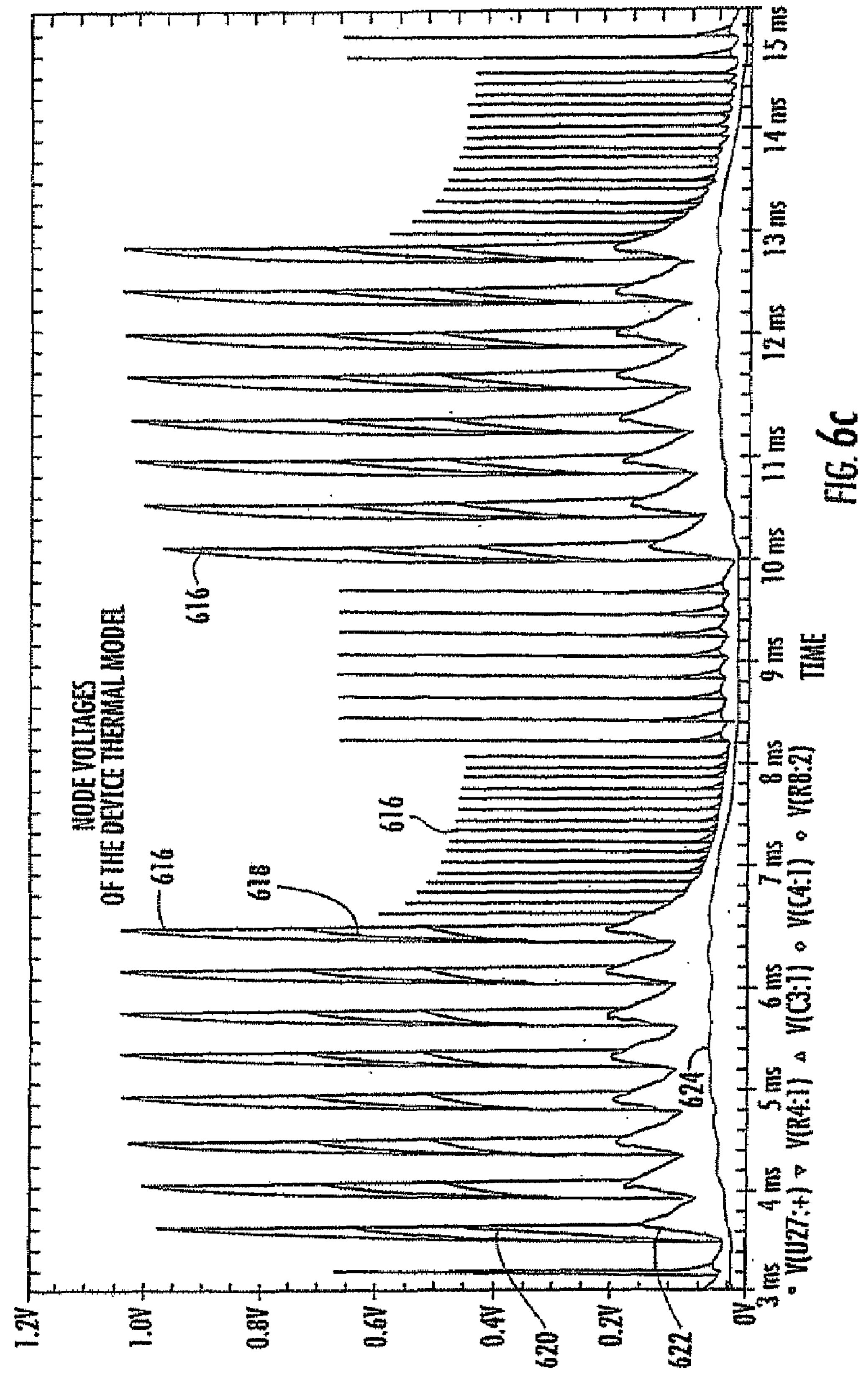
FIG. 6*c* is a representation of the equivalent node voltage of a Pspice representation of the thermal model.

FIG. 6*a* is an amplitude-time plot of a digital pulse gating signal which is assumed as an example of an input voltage for pulsed constant current source 410 of FIG. 4. FIG. 6*b* is a representation of the temperature of the chip or junction 211 of FIG. 2 calculated in response to the drive of FIG. 6*a*. As illustrated, the peak voltages, representing peak temperatures, are related to the widths or durations of the excitation of FIG. 6*a*. FIG. 6*b* is derived by multiplying curve 616 of FIG. 6*c* by 100 plus the addition of an assumed heat sink temperature of 40 degrees C. (616×100+40) in order to scale the Pspice software output voltage plot to temperature in degrees C. for the assumed offset heat sink temperature of 40 degrees C. FIG. 6*c* is a representation of the real-time voltages produced by the Pspice software operating on the equivalent circuit of FIG. 4, with the drive of FIG. 6*a*, showing that the peak junction "temperature" is represented by voltage plots 616. In addition, FIG. 6*c* also includes plots 622, 624, and 626, representing the voltages at the thermal nodes of FIG. 2 corresponding to transmission-line nodes of FIG. 4. More particularly, plot 616 of FIG. 6*c* represents the voltage at node 416 of FIG. 4, plot 618 of FIG. 6*c* represents the voltage at node 418 of FIG. 4, plot 620 of FIG. 6*c* represents the voltage at node 420 of FIG. 4, plot 622 of FIG. 6*c* represents the voltage at node 422 of FIG. 4, and plot 624 of FIG. 6*c* represents the voltage at node 424 of FIG. 4.

The disclosed invention provides a method for ready analysis of pulse-to-pulse temperature variations in solid-state devices and amplifiers using traditional analog computation methods in traditional circuit simulators such as Pspice, and these determinations may be made in real time by use of the actual circuit equivalent or embodiment of the thermal model for any combination of pulsewidth and duty cycle variation. The thermal equivalent circuit is in the form of a lumped transmission-line model of distributed resistive and capacitive elements, fed by a pulsed constant-current source. In such an equivalence, the electrical resistance and capacitance correspond to thermal resistance (impedance) and capacitance, respectively. The pulsed constant current source corresponds to heat, and the temperature corresponds to voltage. Assignment (choosing component values for the electrical circuit analog of the thermal system, or selection of achievable resistor and capacitor values, and current and voltage levels for hardware analog circuits, and scaling of the circuit parameters for application to the processor performing the simulation can be determined in a variety of ways, including empirical curve fitting to step response performance modeled with thermal finite element analysis models or the actual step response measured with an infrared (IR) sensor. The combination of thermal modeling together with the use of electrical circuit simulation software provides a control signal which is equivalent to the instantaneous temperature of the solid-state device. This control signal is then used, as for example in a feedback manner, in order to keep the temperature of the solid-state device within the desired values, regardless of pulse width or duty cycle. Such a simulator can even take into account variations in the amplitudes of the powering pulses, if desired, by varying the magnitude of the constant current drive waveform from pulse to pulse.

Other embodiments of the invention will be apparent to those skilled in the art. For example, remote detection of the latching condition for fault detection and fault isolation is readily provided. Instead of automatic resetting in conjunction with each pulse, manual resetting by operator intervention in response to a fault indication may be used. An actual circuit embodiment of the pspice circuit simulation can be implemented in hardware using comparators and latches for peak voltage monitoring (to thereby monitor peak simulated temperature), with interlocking of the excitation pulse source until (or so long as) the predicted temperature returns to a safe value or to some predesignated normal level.

Additional temperature simulation monitoring of the heat sink can also be incorporated into the simulation to detect coolant system compromise or failure, and to provide a warning or shut down in the case of compromise. Such additional temperature monitoring can be readily accomplished by a summing circuit for adding the chip temperature signal to the heat-sink temperature signal and comparison of the sum signal to generate the go/no-go signal.

Thus, a power device (11) includes a solid-state device (12) having (a) a thermal mass and (b) reliability and performance characteristics which vary in response to the temperature of the solid-state device (12). The power device (11) also includes a controllable powering arrangement (16) for controllably providing power to the solid-state device (12). A controller (18) is coupled to the controllable powering arrangement (16), for controlling the controllable powering arrangement (16) for providing power to the solid-state device (12) in a manner that includes pulses selectable in at least one of amplitude and duration. As a result, or whereby, the power produced in the solid-state device (12) varies from time to time as operating conditions change. A heat transfer (20, 22) arrangement is coupled to the solid-state device (12) for transferring heat from the solid-state device (12). The heat transfer arrangement (20, 22) includes thermal masses mutually separated by thermal impedances, whereby the temperature of the solid-state device (12) varies in response to the power, thermal masses, and thermal impedances. According to an aspect of the invention, a simulator (24) is coupled to one of the controller (18) and the powering arrangement (16), and generates an electrical analog of (a) the thermal masses separated by thermal impedances of the heat transfer arrangement and (b) the thermal mass of the solid-state device (12), where the simulation means (24) analogizes an electrical characteristic, such as voltage, or possibly current, impedance, or the like, to the temperature of the solid-state device (12). A limiter (28) is coupled to the simulator (24) and to the controller (18), for monitoring the electrical characteristic, and for preventing the controller (18) from commanding the production of power for application to the solid-state device (12) in an amount which raises the temperature of the solid-state device (12), as represented by the electrical characteristic, above a predetermined temperature. In a particularly advantageous version of this aspect of the invention, the simulator (24) is implemented in software, and in a most preferred embodiment, the software is Pspice.

In a particular embodiment of the invention, a delay (30) is interposed between the generation of the pulses (18) and the time they are applied to the chip (12), in order to provide time for processing of the pulses in the simulator to determine the temperature which will be achieved. Additional temperatures along the heat flow path (HS) of the chip may be monitored (716) and processed together with the chip-temperature-representative signal to produce composite limiting signals. The limiting value of the temperature may be fixed during operation, as by generation of a fixed voltage by divider 728.

What is claimed is:

1. A method for operating a power device including a solid-state chip, said method comprising the steps of:

generating pulse signals;

applying said pulse signals to said chip, to thereby generate heat in said chip;

applying said pulse signals to a software or hardware electrical simulator, which electrical simulator is configured to represent the thermal characteristics of said chip and its environs, to thereby generate electrical signals representative of the temperature of said chip in response to said pulse signals;

monitoring said electrical signals representative of the temperature in said chip, and producing an overtemperature signal in response to an excursion of the simulated temperature of said chip beyond a specified limit; and inhibiting said generating of said pulse signals in response to said overtemperature signal.

2. A method according to claim 1, further comprising the step, between said steps of (a) generating pulse signals and (b) applying said pulse signals, of delaying said pulse signals.

3. A method according to claim 1, further comprising the steps of generating an additional temperature signal representing the temperature of a portion of the thermal flow path associated with said chip, and summing said additional temperature signal with said electrical signals representative of the temperature in said chip, to produce a summed signal for comparison with a threshold.

* * * * *